US012748719B2

(12) United States Patent
Kuo et al.

(10) Patent No.: US 12,748,719 B2
(45) Date of Patent: Sep. 29, 2026

(54) PCIE CLOCK DETECTION CIRCUIT AND METHOD THEREOF

(71) Applicant: MEDIATEK INC., Hsin-Chu (TW)

(72) Inventors: Hung-Chang Kuo, Hsinchu City (TW); Wei-De Jeng, Hsinchu City (TW); Mao-Cheng Chiu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 94 days.

(21) Appl. No.: 18/817,233

(22) Filed: Aug. 28, 2024

(65) Prior Publication Data

US 2025/0077460 A1 Mar. 6, 2025

Related U.S. Application Data

(60) Provisional application No. 63/580,439, filed on Sep. 5, 2023.

(51) Int. Cl.

| | |
|---|---|
| ***G06F 1/04*** | (2006.01) |
| ***G06F 13/42*** | (2006.01) |
| ***H03K 19/20*** | (2006.01) |

(52) U.S. Cl.

CPC ............ *G06F 13/4221* (2013.01); *G06F 1/04* (2013.01); *H03K 19/20* (2013.01); *G06F 2213/0026* (2013.01)

(58) Field of Classification Search

CPC ................... G06F 13/4221; G06F 1/04; G06F 2213/0026; H03K 19/20

USPC ............................................................. 710/1

See application file for complete search history.

(56) References Cited

U.S. PATENT DOCUMENTS 6,639,449 B1 * 10/2003 De La Cruz .............. G06F 1/08 327/407
7,071,738 B1 * 7/2006 Nguyen .................... G06F 1/08 327/144
7,084,670 B1 * 8/2006 Chiu .................... G01R 25/005 327/8
7,342,430 B1 * 3/2008 Chiang ..................... G06F 1/06 327/295
8,686,764 B2 * 4/2014 Bulzacchelli ........ H03K 17/005 327/108
10,884,448 B1 * 1/2021 Lan ....................... G06F 21/725
11,112,855 B1 * 9/2021 Kuo ...................... G06F 1/3296
2013/0300481 A1 * 11/2013 Bulzacchelli .......... H03K 3/017 327/175

(Continued)

FOREIGN PATENT DOCUMENTS

KR 20250067392 A * 5/2025 ......... G06F 13/4221

*Primary Examiner* — Christopher B Shin
(74) *Attorney, Agent, or Firm* — Winston Hsu

(57) ABSTRACT

A PCIe clock detection circuit includes a clock detector, a clock receiver, a counter coupled to the clock receiver, a multiplexer coupled to the counter, and an AND gate coupled to the clock detector and the multiplexer. The clock detector is used to detect amplitude of a clock signal and generate a clock detection signal accordingly. The clock receiver is used to generate a reference clock signal according to the clock signal. The counter is used to generate a counter signal according to the reference clock signal. The multiplexer is used to generate a MUX output signal according to the counter signal and a reference signal. The AND gate is used to generate a clock detection output signal according to the clock detection signal and the MUX output signal.

16 Claims, 4 Drawing Sheets

(56) References Cited

U.S. PATENT DOCUMENTS

| | | | | |
|---|---|---|---|---|
| 2021/0409011 | A1* | 12/2021 | Kim | H03K 5/01 |
| 2025/0077460 | A1* | 3/2025 | Kuo | G06F 13/4221 |

* cited by examiner

PCIE CLOCK DETECTION CIRCUIT AND METHOD THEREOF

CROSS REFERENCE TO RELATED APPLICATIONS

This application claims the benefit of U.S. Provisional Application No. 63/580,439, filed on Sep. 5, 2023. The content of the application is incorporated herein by reference.

BACKGROUND

Peripheral Component Interconnect Express or PCIe, is a high-speed serial computer expansion bus standard designed to replace the older PCI, PCI-X, and AGP bus standards. It is the common motherboard interface for personal computers' graphics cards, sound cards, hard disk drive host adapters, SSDs, Wi-Fi and Ethernet hardware connections. The PCIe 6.0 doubles the data transfer rate of PCIe 5.0 to transferring data at up to 64 GT/s (Giga Transmission per second) per lane.

PCIe is a versatile bus standard that can be used for a variety of purposes. It is the most common interface for graphics cards, and it is also used for storage devices, network cards, and other high-performance peripherals. It has the advantage of scalability, compatibility and flexibility. In terms of scalability, PCIe allows devices to use multiple lanes for data transmission, ranging from 1 to 32, depending on the performance requirements. This enables devices to be hot-plugged and hot-swapped without rebooting the system. PCIe is also backward compatible with previous versions of the standard and can work with legacy PCI and PCI-X devices through adapters or bridges. Additionally, PCIe supports different form factors, such as full-height, low-profile, and mini cards. Regarding flexibility, PCIe allows devices to use various protocols, such as NVMe for solid-state drives, Thunderbolt for external devices, and USB 3.1 for general-purpose peripherals.

However, a potential issue with PCIe is the occurrence of card dropouts when the PCIe End-Point (EP) transitions from the L1.2 low power state back to the L0 active state. This problem is of significant concern as it can lead to system instability, negatively impacting the user experience. The transition from the L1.2 low power state to the L0 active state is crucial, and if not managed properly, it can cause the PCIe device to become unresponsive or disconnect from the system, resulting in data loss and poor user experience. Therefore, ensuring a smooth and reliable transition between these power states is essential to maintain system stability and user satisfaction.

SUMMARY

An embodiment provides a Peripheral Component Interconnect Express (PCIe) clock detection circuit. The PCIe clock detection circuit comprises a clock detector, a clock receiver, a counter coupled to the clock receiver, a multiplexer coupled to the counter, and an AND gate coupled to the clock detector and the multiplexer. The clock detector is used to detect amplitude of a clock signal and generate a clock detection signal accordingly. The clock receiver is used to generate a reference clock signal according to the clock signal. The counter is used to generate a counter signal according to the reference clock signal. The multiplexer is used to generate a MUX output signal according to the counter signal and a reference signal. The AND gate is used to generate a clock detection output signal according to the clock detection signal and the MUX output signal.

Another embodiment provides a method for clock detection implemented by a Peripheral Component Interconnect Express (PCIe) clock detection circuit. The PCIe clock detection circuit comprises a clock detector, a clock receiver, a counter coupled to the clock receiver, a counter, a multiplexer coupled to the counter, and an AND gate coupled to the clock detector and the multiplexer. The method comprises detecting an amplitude of a clock signal by the clock detector and generate a clock detection signal, generating a reference clock signal by the clock receiver according to the clock signal, generating a counter signal by the counter according to the reference clock signal, generating a MUX output signal by the multiplexer according to the counter signal and a reference signal, and generating a clock detection output signal by the AND gate according to the clock detection signal and the MUX output signal.

Another embodiment provides a PCI Express (PCIe) clock detection circuit comprising a plurality of frequency meters, a control and status register module coupled to each of the plurality of frequency meters, and an interrupt control module coupled to each of the plurality of frequency meters. Each frequency meter is used to measure a frequency of a clock signal. The control and status register module is used to adjust a measurement range of the each frequency meter and generate a status signal according to a measurement result of the each frequency meter. The interrupt control module is used to generate an interrupt signal when the frequency of the clock signal is deviated from a norm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
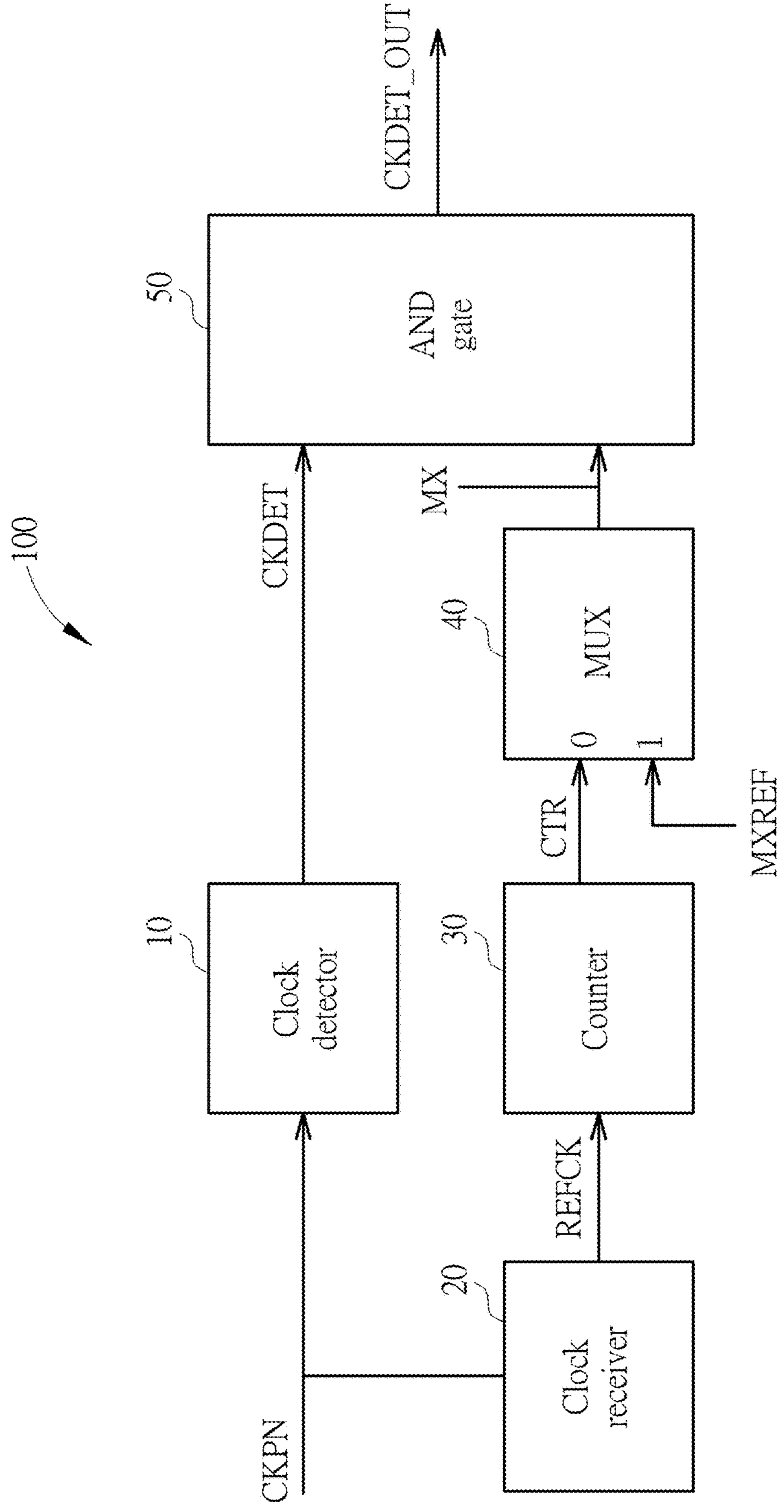
FIG. 1 depicts an embodiment of PCIe clock detection circuit.

The following description is directed at certain implementations for the purpose of describing innovative aspects of this disclosure. However, a person with ordinary skill in the art will readily recognize that the teachings herein can be applied in a multitude of different ways. The described implementations can be implemented in any device, system, or network capable of transmitting and receiving signals according to one or more of the specifications released by the Peripheral Component Interconnect Special Interest Group (PCI-SIG), such as the PCIe 4.0 Specification, PCIe 5.0 Specification, and PCIe 6.0 Specification.

PCI Express (PCIe) is a high-speed serial computer expansion bus standard that has been widely adopted in modern computing systems. It is designed to replace older bus standards such as PCI, PCI-X, and AGP. PCIe allows for faster communication between devices, such as graphics cards, solid-state drives, Wi-Fi and Ethernet hardware.

PCIe links consist of one or more lanes, with each lane consisting of four wires (two for receiving and two for transmitting). The number of lanes in a PCIe link determines its width, which can be ×1, ×2, ×4, ×8, ×16, or ×32. The more lanes a PCIe link has, the higher its bandwidth and the faster it can transmit data. For example, a PCIe 3.0×1 link has a bandwidth of 985 MB/s, while a PCIe 3.0×16 link has a bandwidth of 15.75 GB/s.

In addition to width, PCIe links can also operate at different speeds or generations. Each new generation of PCIe roughly doubles the bandwidth of the previous generation. For example, PCIe 2.0 has a transfer rate of 5 GT/s (giga transfers per second), PCIe 3.0 has a transfer rate of 8 GT/s, and PCIe 4.0 has a transfer rate of 16 GT/s. The latest version, PCIe 5.0, has a transfer rate of 32 GT/s, and PCIe 6.0 (expected to be released in 2021) will have a transfer rate of 64 GT/s.

The PCIe specification defines four link power state levels that are software controlled: fully active state (L0), electrical idle or standby state (L0s), lower power standby/slumber state (L1), and link off state (L3). As links transition from L0 to L3 states, both power saving and exit latencies increase. L0 is the normal operating state, where data transfer can occur at the negotiated speed and width. L0s is a low-power state where the link is electrically idle, but the link speed and width are maintained. L1 is a deeper low-power state where the link speed and width are not maintained, and the link may enter sub-states (L1.0, L1.1, L1.2) with different levels of power saving and exit latency. L3 is the lowest power state where the link is completely powered off.

To establish a PCIe link between two devices, a link training process is performed, which includes several phases: detection, polling, configuration, and recovery. During detection, the devices detect each other's presence and initiate the link training. During polling, the devices exchange information about their capabilities and negotiate the link speed and width. During configuration, the devices finalize the link parameters and perform equalization to optimize the signal quality. During recovery, the devices enter the L0 state and are ready for data transfer. If a link error or a power management event occurs, the link may re-enter the link training process to recover or reconfigure the link.

PCIe L1.2 is a low-power state of the PCIe interface that allows all high-speed circuits to be turned off, thereby reducing power consumption. It is a sub-state of L1, which is another low-power state of the PCIe interface. L1.2 is the lowest power state of the PCIe interface and is used to extend battery life in mobile devices.

L1.2 is enabled by the Latency Tolerance Reporting (LTR) mechanism, which tells the host the latency tolerance a device has in response to an interrupt from the device. This allows the host to judiciously decide how long to wait before servicing the interrupt from the device in order to coordinate multiple devices and achieve the maximum power optimizations for the system.

When a PCIe link is in L1.2 state, only the CLKReq #signal is maintained, and most modules are in a powered-off state. Both L1.1 and L1.2 permit the PCIe transceivers to turn off their Phase-Locked Loops (PLLs) along with their receivers and transmitters, while L1.2 even allows turning off the common mode keeper circuits.

The transition from the L1.2 low power state back to the L0 active state is a critical process. If not managed properly, it can lead to card dropouts, which results in the PCIe device becomes unresponsive or disconnects from the system. This can cause data loss, system instability, and a poor user experience.

In a PCIe system, the Root Complex (RC) acts as the host and is responsible for managing and controlling communication with the End Point (EP) devices connected to it. The RC is typically integrated into the system chipset, such as the northbridge or the CPU itself in modern systems. The EP, on the other hand, is a device that is connected to the PCIe bus and communicates with the RC, such as a graphics card, network card, or storage device.

To ensure synchronized communication between the RC and EP, a reference clock signal is used. This reference clock is typically generated by the RC and operates at a frequency of 100 MHz. The reference clock is distributed to all the connected EPs, allowing them to synchronize their operations with the RC.

However, if the RC generates a glitch or an unexpected short pulse in the reference clock signal, it can lead to a problem known as a "card dropout" at the EP. This glitch can cause the EP to mistakenly interpret the signal as a valid reference clock, even though the clock signal has not stabilized yet.

When the EP detects what it believes to be a valid reference clock signal, it activates its Phase-Locked Loop (PLL). The PLL is a control system that generates an output signal whose phase is related to the phase of the input reference clock signal. The PLL essentially multiplies the incoming reference clock frequency to generate a higher-frequency clock signal required for the EP's operation.

If the PLL at the EP starts operating prematurely, before the reference clock signal has properly stabilized, it may lock onto an incorrect frequency. This happens because the PLL is trying to synchronize with an unstable or invalid clock signal. As a result, the EP may fail to communicate correctly with the RC, leading to a "card dropout."

A card dropout can manifest in various ways, depending on the specific EP device. For example, a graphics card may display visual artifacts, freeze, or go blank, while a network card may lose connectivity. In some cases, the dropout may require a system reboot to restore proper functionality.

The following description of the embodiments aims to address the aforementioned problem within the PCIe system.

FIG. 1 depicts an embodiment of PCIe clock detection circuit 100. The PCIe clock detection circuit 100 includes a clock detector 10, a clock receiver 20, a counter 30 coupled to the clock receiver 20, a multiplexer (MUX) 40 coupled to the counter 30, and an AND gate 50 coupled to the clock detector 10 and the multiplexer 40. The clock detector 10 is used to detect amplitude of a clock signal CKPN and generate a clock detection signal CKDET accordingly. The clock receiver 20 is used to generate a reference clock signal REFCK according to the clock signal CKPN. The counter 30 is used to generate a counter signal CTR according to the reference clock signal REFCK. The multiplexer 40 is used to generate a MUX output signal MX according to the counter signal CTR and a reference signal MXREF. The AND gate 50 is used to generate a clock detection output signal CKDET_OUT according to the clock detection signal CKDET and the MUX output signal MX.

In some embodiments, the clock signal CKPN can be a differential clock signal. In some embodiments, the clock receiver 20 can be a buffer circuit. If the clock signal CKPN has the frequency of 100 MHz, the reference clock signal REFCK would also have the frequency of 100 MHz. Thus, the reference clock signal REFCK can be identical to the clock signal CKPN in amplitude and frequency.

In actual application, the PCIe standard specifies a 100 MHz reference clock. This clock provides timing information for data transfers within the PCIe link. The reference clock must have at least ±300 ppm frequency stability for Gen 1, 2, 3, and 4, and at least ±100 ppm frequency stability for Gen 5, at both the transmitting and receiving devices.

The clock detection signal CKDET is raised to high (i.e., binary value 1) when the clock detector 10 detects that the amplitude of the clock signal CKPN rises above a threshold voltage (e.g., 0.5V). The counter 30 can determine whether the reference clock signal REFCK is indeed a continuous clock signal (e.g., continue for 100 μs) or a glitch from the environment.

If the counter 30 determines the reference clock signal REFCK is indeed a continuous clock signal, the counter 30 sends the counter signal CTR raised to high (i.e., bit value 1) to the MUX 40. The MUX 40 receives the counter signal CTR (with bit value 1) and the reference signal MXREF (always having bit value 1). The MUX 40 can act as an AND gate and generate the MUX output signal MX (which has bit value 1 in this case) according these two inputs.

The AND gate 50 then receives the MUX output signal MX and the clock detection signal CKDET. When both signals (i.e., the MUX output signal MX and the clock detection signal CKDET) are high, the AND gate 50 outputs the clock detection output signal CKDET_OUT with bit value 1. Thus, the PLL can start operating at the proper time after the clock signal CKPN is properly delivered to the End-Point. This can avoid the PLL lock onto an incorrect frequency, thereby preventing to a card dropout at the End-Point.

In contrast, if the counter 30 determines the reference clock signal REFCK is not a continuous clock signal, the counter 30 sends the counter signal CTR dropped to low (i.e., bit value 0) to the MUX 40. The MUX 40 receives the counter signal CTR (with bit value 0) and the reference signal MXREF (always having bit value 0). The MUX 40 can act as an AND gate and generates the MUX output signal MX (which has bit value 0 in this case) according these two inputs.

The AND gate 50 then receives the MUX output signal MX and the clock detection signal CKDET. When the MUX output signal MX is low and the clock detection signal CKDET is high, the AND gate 50 outputs the clock detection output signal CKDET_OUT with bit value 0. Thus, the PLL would not start operating before the clock signal CKPN is properly delivered to the End-Point. This can avoid the PLL lock onto an incorrect frequency, thereby preventing to a card dropout at the End-Point.

Figure 2:
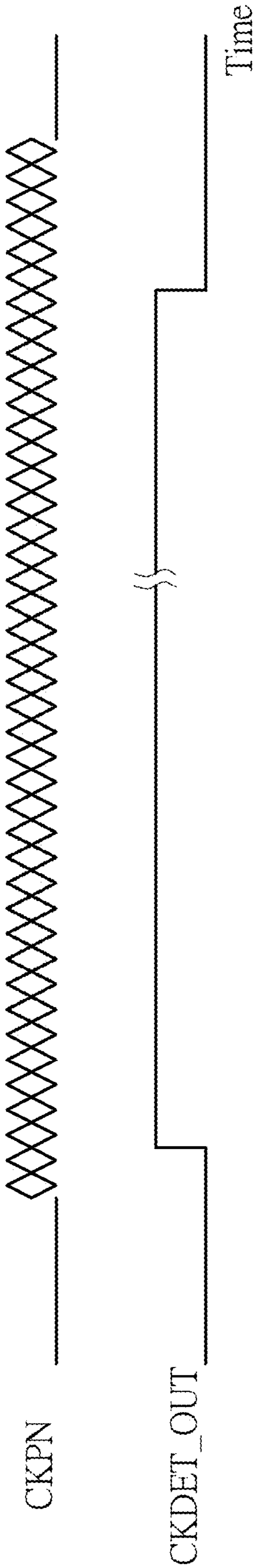
FIG. 2 depicts the simulation waveforms generated by the PCIe clock detection circuit of FIG. 1.

FIG. 2 depicts simulation waveforms generated by a PCIe clock detection circuit 100. The vertical axis of the waveforms represents voltage levels, while the horizontal axis represents time. The top waveform shows the CKPN signal, which is the reference clock signal provided from the Root Complex (RC) to the End Point (EP) in the PCIe system. The CKPN signal has a regular oscillating clock waveform.

The bottom waveform represents the CKDET_OUT signal, which is the output from the clock detection circuit 100 to indicate when the CKPN reference clock is considered stable and valid.

The crucial point illustrated is that the CKDET_OUT signal goes high (rises to the high voltage level) at the proper time-which is after the CKPN clock signal has been properly delivered and has stabilized. This proper timing of the CKDET_OUT signal helps avoid issues where the Phase-Locked Loop (PLL) at the EP might lock onto an incorrect frequency if it starts too early, before the reference clock is stable.

By having the clock detection circuit 100 properly time the CKDET_OUT signal to go high only after CKPN is stable, potential problems like communication instability and card dropouts at the EP can be prevented. The waveforms visualize how the clock detection circuit achieves this proper synchronization between the reference clock becoming valid and the EP starting to use that clock.

Figure 3:
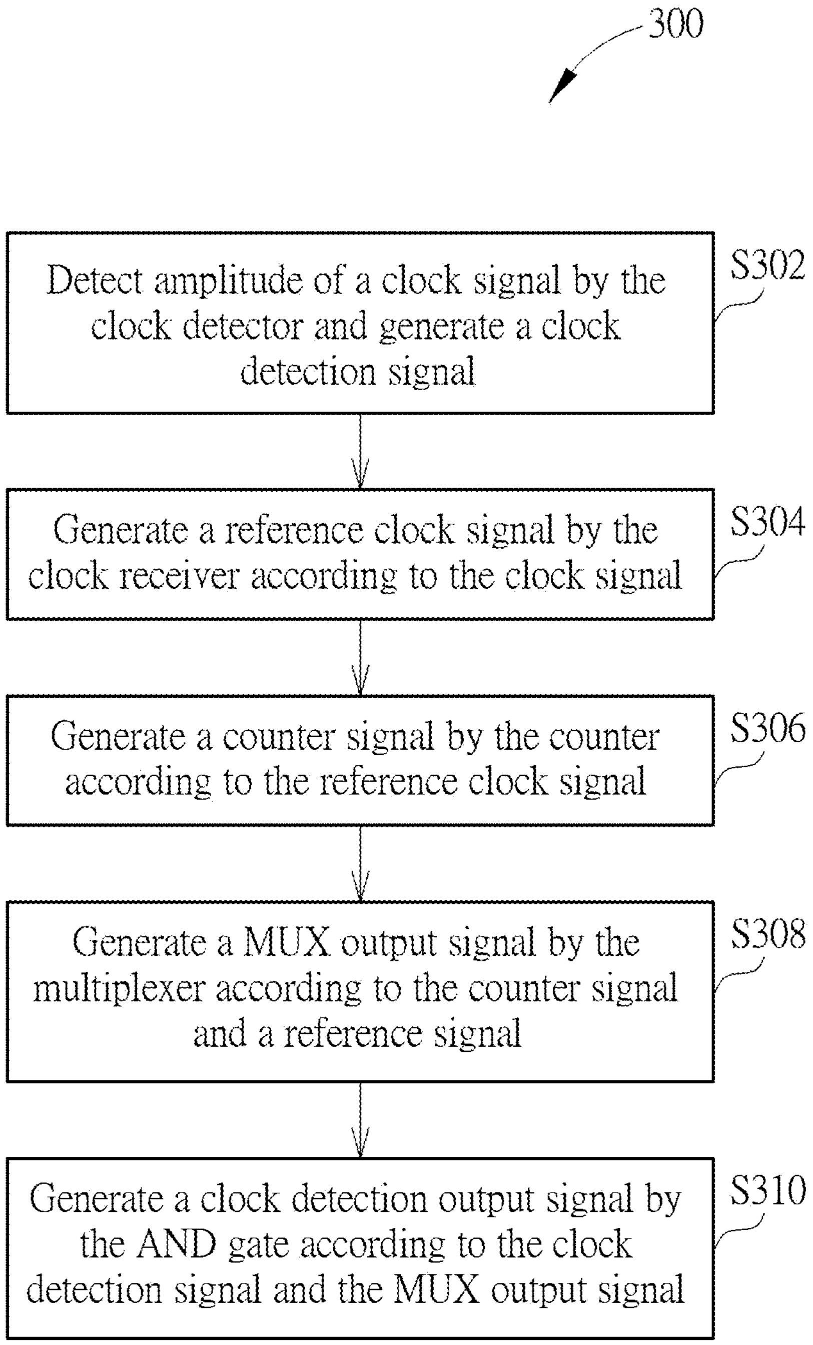
FIG. 3 depicts a flowchart of a method for clock detection implemented by the PCIe clock detection circuit of FIG. 1.

FIG. 3 depicts a flowchart of a method 300 for clock detection implemented by the PCIe clock detection circuit 100. The method 300 includes the following steps:

S302: Detect amplitude of a clock signal CKPN by the clock detector 10 and generate a clock detection signal CKDET;

S304: Generate a reference clock signal REFCK by the clock receiver 20 according to the clock signal CKPN;

S306: Generate a counter signal CTR by the counter 30 according to the reference clock signal REFCK;

S308: Generate a MUX output signal MX by the multiplexer 40 according to the counter signal CTR and a reference signal MXREF; and S310: Generate a clock detection output signal CKDET_OUT by the AND gate 50 according to the clock detection signal CKDET and the MUX output signal MX.

The specifics of the operation have been described previously in details. For brevity, the description will not be repeated herein.

Figure 4:
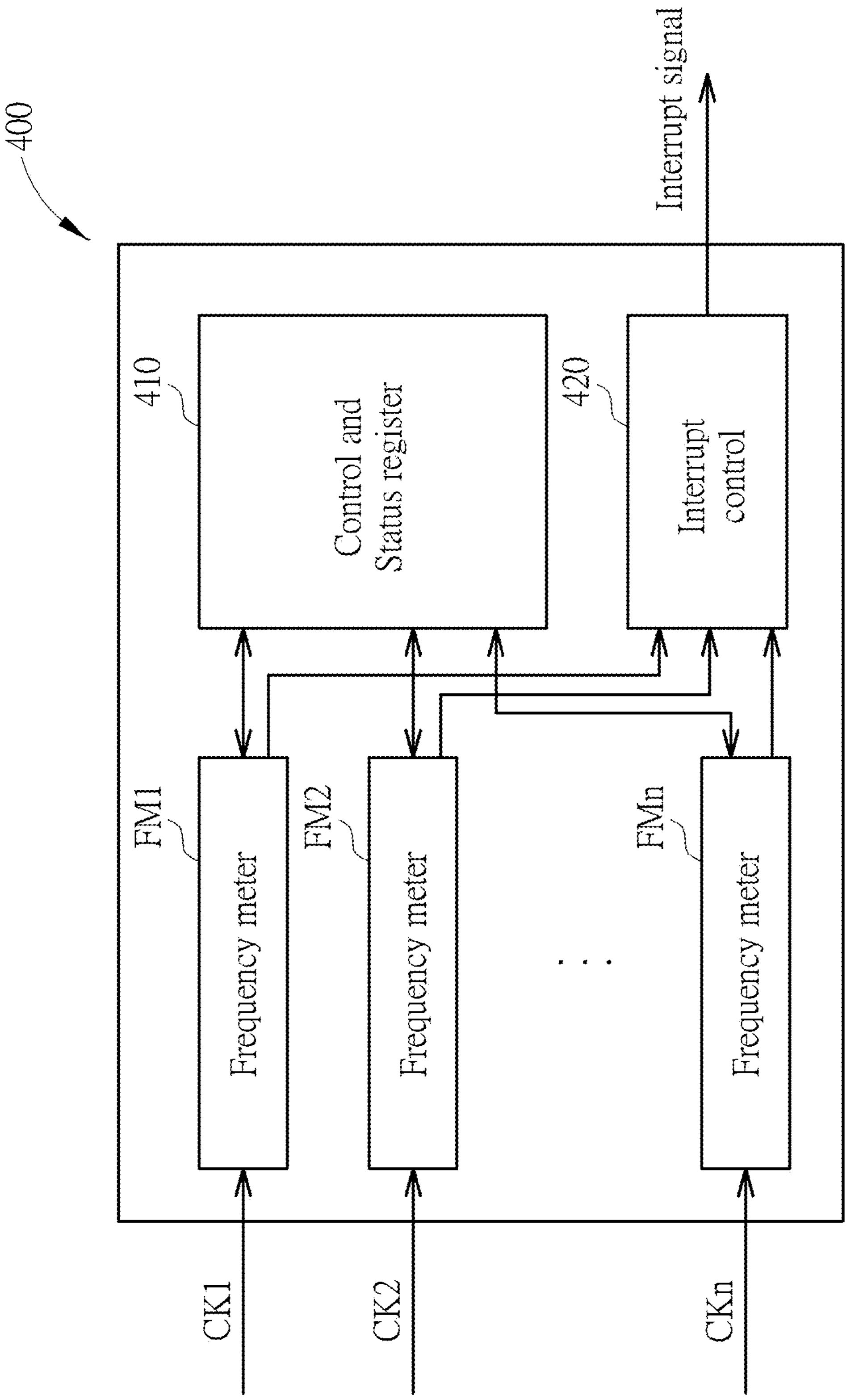
FIG. 4 depicts another embodiment of a PCIe clock detection circuit.

FIG. 4 depicts an embodiment of a PCIe clock detection circuit 400. The PCIe clock detection circuit 400 includes a plurality of frequency meters FM1-FMn, a control and status register module 410 coupled to each of the plurality of frequency meters FM1-FMn, and an interrupt control module 420 coupled to each of the plurality of frequency meters FM1-FMn. The frequency meters FM1-FMn are used to measure frequencies of clock signals CK1-CKn respectively. The control and register module 410 is used to adjust a measurement range of the each frequency meter (e.g., FM1) and generate a status signal according to a measurement result of the each frequency meter. The interrupt control module 420 is used to generate an interrupt signal when the frequency of the clock signal (e.g., CK1) is deviated from the norm.

The terminology used in the description of the various embodiments herein is for the purpose of describing particular embodiments only and is not intended to be limiting. In the description of the various embodiments and the appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The terms "coupled," "connected," "connecting," and "electrically connected" are used interchangeably in this document to refer to the state of being electrically or electronically connected. Similarly, a first entity is considered to be in "communication" with a second entity (or entities) when the first entity electrically sends and/or receives information signals to/from the second entity, regardless of whether the signals contain voice information or non-voice data/control information, and irrespective of the type of signals (analog or digital). It should be noted that the various figures, including component diagrams, shown and discussed in this document are for illustrative purposes only and are not drawn to scale.

The various illustrative components, logic, logical blocks, modules, circuits, operations and algorithm processes described in connection with the embodiments disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The various illustrative components, logic, logical blocks, modules, circuits, operations, and algorithm processes described in connection with the embodiments disclosed herein may be implemented as electronic hardware, firmware, software, or combinations thereof, including the structures disclosed in this specification and their structural equivalents. The interchangeability of hardware, firmware, and software has been described generally in terms of functionality and illustrated in the various illustrative components, blocks, modules, circuits, and processes described above. The choice of implementing such functionality in hardware, firmware, or software depends on the particular application and design constraints imposed on the overall system.

The hardware and data processing apparatus used to implement the various illustrative components, logics, logical blocks, modules, and circuits described in connection with the aspects disclosed herein may be implemented or performed with a general-purpose single-chip or multi-chip processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor or conventional any processor, controller, microcontroller, or state machine. A processor may also be implemented as a combination of computing devices, such as a combination of a DSP and a microprocessor, multiple microprocessors, one or more microprocessors in conjunction with a DSP core, or any other such configuration. In some embodiments, specific processes, operations, and methods may be performed by circuitry that is dedicated to a particular function.

As described above, in some aspects embodiments of the subject matter described in this specification can be implemented as software. For example, various functions of components disclosed herein or various blocks or steps of a method, operation, process or algorithm disclosed herein can be implemented as one or more modules of one or more computer programs. Such computer programs can include non-transitory processor-executable or computer-executable instructions encoded on one or more tangible processor-readable or computer-readable storage media for execution by, or to control the operation of, data processing apparatus including the components of the devices described herein. By way of example, and not limitation, such storage media may include RAM, ROM, EEPROM, CD-ROM or other optical disk storage, magnetic disk storage or other magnetic storage devices, or any other medium that may be used to store program code in the form of instructions or data structures. Combinations of the above should also be included within the scope of storage media.

While some embodiments comprise the disclosed features and may therefore include additional features not specifically described, other embodiments may be essentially free of or completely free of non-disclosed elements. That is, non-disclosed elements may optionally be essentially omitted or completely omitted.

Additionally, various features that are described in this specification in the context of separate embodiments also can be implemented in combination in a single implementation. Conversely, various features that are described in the context of a single implementation also can be implemented in multiple embodiments separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example process in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the embodiments described should not be understood as requiring such separation in all embodiments, and it should be understood that the described program components and systems can generally be integrated together in a single software package or packaged into multiple software packages. Additionally, other embodiments are within the scope of the following claims. In some cases, the actions recited in the claims can be performed in a different order and still achieve desirable results.

Various modifications to the embodiments described in this disclosure may be readily apparent to persons having ordinary skill in the art, and the generic principles defined herein may be applied to other embodiments without departing from the spirit or scope of this disclosure. Thus, the claims are not intended to be limited to the embodiments shown herein, but are to be accorded the widest scope consistent with this disclosure, the principles and the novel features disclosed herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Peripheral Component Interconnect Express (PCIe) clock detection circuit comprising:

a clock detector configured to detect amplitude of a clock signal and generate a clock detection signal accordingly;

a clock receiver configured to generate a reference clock signal according to the clock signal;

a counter coupled to the clock receiver, configured to generate a counter signal according to the reference clock signal;

a multiplexer coupled to the counter, configured to generate a MUX output signal according to the counter signal and a reference signal; and an AND gate coupled to the clock detector and the multiplexer, configured to generate a clock detection output signal according to the clock detection signal and the MUX output signal.

2. The PCIe clock detection circuit of claim 1, wherein the clock receiver is a buffer circuit.

3. The PCIe clock detection circuit of claim 1, wherein the clock detection signal is raised to a high level when the clock detector detects that the amplitude of the clock signal is above a threshold voltage.

4. The PCIe clock detection circuit of claim 1, wherein the counter signal is raised to a high level if the reference clock signal is continuous.

5. The PCIe clock detection circuit of claim 1, wherein the reference clock signal is identical to the clock signal in amplitude and frequency.

6. The PCIe clock detection circuit of claim 1, wherein the clock signal has a frequency of 100 MHz.

7. The PCIe clock detection circuit of claim 1, wherein the reference clock signal has a frequency of 100 MHz.

8. The PCIe clock detection circuit of claim 1, wherein the clock signal is a differential clock signal.

9. A method for clock detection implemented by a Peripheral Component Interconnect Express (PCIe) clock detection circuit, the PCIe clock detection circuit comprising a clock detector, a clock receiver, a counter coupled to the clock receiver, a multiplexer coupled to the counter, and an AND gate coupled to the clock detector and the multiplexer, the method comprising:

detecting amplitude of a clock signal by the clock detector and generate a clock detection signal;

generating a reference clock signal by the clock receiver according to the clock signal;

generating a counter signal by the counter according to the reference clock signal;

generating a MUX output signal by the multiplexer according to the counter signal and a reference signal; and generating a clock detection output signal by the AND gate according to the clock detection signal and the MUX output signal.

10. The method of claim 9, wherein the clock receiver is a buffer circuit.

11. The method of claim 9, wherein the counter signal is raised to a high level if the reference clock signal is continuous.

12. The method of claim 9, wherein the clock detection signal is raised to a high level when the clock detector detects that the amplitude of the clock signal is above a threshold voltage.

13. The method of claim 9, wherein the reference clock signal is identical to the clock signal in amplitude and frequency.

14. The method of claim 9, wherein the clock signal has a frequency of 100 MHz.

15. The method of claim 9, wherein the reference clock signal has a frequency of 100 MHz.

16. The method of claim 9, wherein the clock signal is a differential clock signal.

* * * * *